(12) United States Patent
Furuta (10) Patent No.: US 9,574,745 B2
(45) Date of Patent: Feb. 21, 2017

(54) LIGHT SOURCE APPARATUS (71) Applicant: OLYMPUS CORPORATION, Tokyo (JP)

(72) Inventor: Koichiro Furuta, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 242 days.

(21) Appl. No.: 14/562,928

(22) Filed: Dec. 8, 2014

(65) Prior Publication Data

US 2015/0146409 A1 May 28, 2015

Related U.S. Application Data (63) Continuation of application No. PCT/JP2013/068216, filed on Jul. 3, 2013.

(30) Foreign Application Priority Data

Jul. 9, 2012 (JP) ................. 2012-153232

(51) Int. Cl.
*F21V 9/16* (2006.01)
*G02B 21/08* (2006.01)
(Continued)

(52) U.S. Cl.
CPC ................. *F21V 9/16* (2013.01); *F21V 13/08* (2013.01); *F21V 13/14* (2013.01);
(Continued)

(58) Field of Classification Search
CPC ............ F21V 9/16; F21V 13/08; F21V 13/14; G02B 19/0028; G02B 19/0061; G02B 27/141
See application file for complete search history.

(56) References Cited

U.S. PATENT DOCUMENTS 4,710,940 A * 12/1987 Sipes, Jr. .................. H01S 3/07
372/69
5,663,979 A * 9/1997 Marshall ............. H01S 3/09415
372/101
(Continued)

FOREIGN PATENT DOCUMENTS

JP 2001-338502 A 12/2001
JP 2002-090877 A 3/2002
(Continued)

OTHER PUBLICATIONS

International Search Report dated Oct. 22, 2013 issued in PCT/JP2013/068216.

*Primary Examiner* — Robert May
*Assistant Examiner* — Leah S Macchiarolo
(74) *Attorney, Agent, or Firm* — Scully, Scott, Murphy & Presser, PC (57) ABSTRACT

The invention provides a light source apparatus including first and second light sources that output light in mutually opposing directions along a single optical axis; a wavelength conversion element that is disposed between these light sources and that generates light of a wavelength different from that of said light due to irradiation with the light; a first optical member that is disposed between the wavelength conversion element and the first light source, that transmits the light therefrom, and that reflects back light that is scattered towards the first light source, toward the wavelength conversion element; and a second optical member that is disposed between the wavelength conversion element and the second light source, that transmits the light therefrom, and that deflects, in a direction intersecting the optical axis, the light scattered toward the second light source and the light reflected back by the first optical member.

21 Claims, 5 Drawing Sheets (51) Int. Cl.
- G02B 27/14 (2006.01)
- G02B 19/00 (2006.01)
- H01S 5/00 (2006.01)
- H01S 5/40 (2006.01)
- F21V 13/08 (2006.01)
- F21V 13/14 (2006.01)
- H01S 5/323 (2006.01)

(52) U.S. Cl.
CPC ..... *G02B 19/0028* (2013.01); *G02B 19/0061* (2013.01); *G02B 21/08* (2013.01); *G02B 27/141* (2013.01); *H01S 5/005* (2013.01); *H01S 5/4025* (2013.01); *G02B 2207/113* (2013.01); *H01S 5/32341* (2013.01)

(56) References Cited

U.S. PATENT DOCUMENTS

| | | | |
|---|---|---|---|
| 8,506,091 B2 * | 8/2013 | Wang | G03B 21/20 353/31 |
| 8,733,942 B2 * | 5/2014 | Chang | G02B 26/008 353/31 |
| 9,075,299 B2 * | 7/2015 | Hu | G03B 21/204 |
| 2005/0270775 A1 | 12/2005 | Harbers et al. | |

FOREIGN PATENT DOCUMENTS

| | | |
|---|---|---|
| JP | 2005-347263 A | 12/2005 |
| JP | 2008-160015 A | 7/2008 |
| JP | 2011-048139 A | 3/2011 |
| JP | 2011-243586 A | 12/2011 |
| JP | 2012-013897 A | 1/2012 |
| JP | 2012-023013 A | 2/2012 |
| JP | 2012-093692 A | 5/2012 |

\* cited by examiner

LIGHT SOURCE APPARATUS

CROSS-REFERENCE TO RELATED APPLICATIONS

This is a continuation of International Application PCT/JP2013/068216, with an international filing date of Jul. 3, 2013, which is hereby incorporated by reference herein in its entirety. This application claims the benefit of Japanese Patent Application No. 2012-153232, filed on Jul. 9, 2012, the content of which is incorporated herein by reference.

TECHNICAL FIELD

The present invention relates to a light source apparatus.

BACKGROUND ART

In the related art, semiconductor light sources are used as the light sources in liquid crystal projectors and so forth (for example, see Patent Literature 1). In Patent Literature 1, three types of fluorophores are irradiated with excitation light output from a single semiconductor light source, creating red, green, and blue fluorescence, and these three colors of fluorescence are used to reproduce colors in an image.

In applications such as microscopes, liquid crystal projectors, and the like, a comparatively small region is irradiated with illumination light from a light source. The apparatus in Patent Literature 1, being based on the Etendue principle, is not suitable for applications in which such a small region is illuminated.

In other words, Etendue, which is represented by the product of the cross-sectional area of the light beam and the solid angle of the light beam at a position in the optical system, is conserved from the light source to the irradiation position. Patent Literature 1 considers the arrangement of a plurality of light sources to improve the brightness of the illumination light. In that case, the light-emission area of the light source as a whole becomes large, and Etendue at the light source side becomes large. As a result, although the amount of light from the light source increases due to the increased light-emission area of the entire light source, Etendue at the light source side also increases, causing the light guiding efficiency to drop. In other words, it is not possible to efficiently guide all of the light emitted from the light source to a small illumination region at the irradiation position, and part of the light suffers from vignetting and thus does not contribute to an improvement in the brightness of the illumination region.

CITATION LIST

Patent Literature

{PTL 1}
Japanese Unexamined Patent Application, Publication No. 2012-13897

SUMMARY OF INVENTION

The present invention provides a light source apparatus including a first light source and a second light source that output light in mutually opposing directions along a single optical axis; a wavelength conversion element that is disposed between the first light source and the second light source and that, upon being irradiated with the light output from the first light source and the second light source, generates light of a wavelength different from that of this light; a first optical member that is disposed between the wavelength conversion element and the first light source, that transmits the light from that the first light source, and that, of the light generated in the wavelength conversion element, reflects back light that is scattered towards the first light source, toward the wavelength conversion element, parallel to the optical axis; and a second optical member that is disposed between the wavelength conversion element and the second light source, that transmits the light from the second light source, and that, of the light generated in the wavelength conversion element, deflects, in a direction intersecting the optical axis, the light scattered toward the second light source and the light reflected back by the first optical member.

DESCRIPTION OF EMBODIMENT

A light source apparatus 1 according to an embodiment of the present invention will be described below with reference to the drawings.

Figure 1:
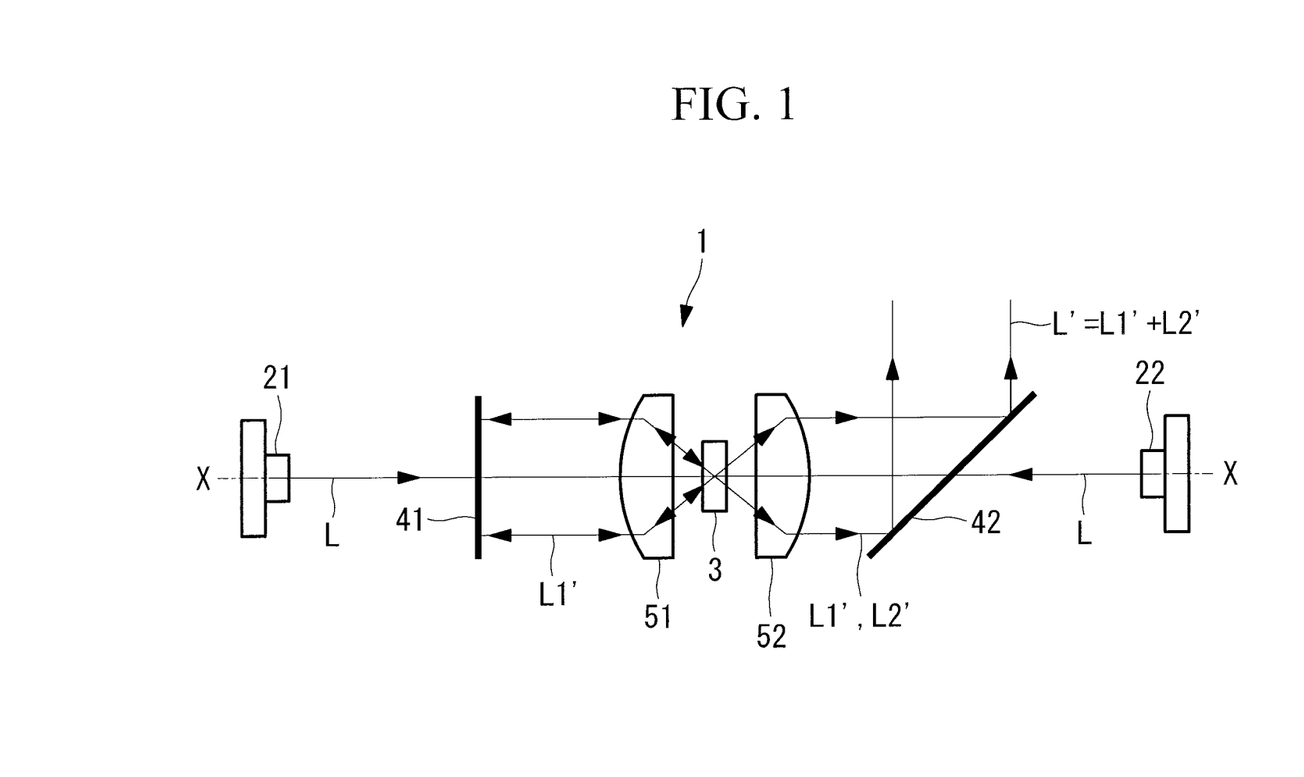
FIG. 1 is a diagram showing the overall configuration of a light source apparatus according to an embodiment of the present invention.

As shown in FIG. 1, the light source apparatus 1 according to this embodiment includes two light sources 21 and 22 that output light beams in mutually opposing directions along a single optical axis X; a wavelength conversion element 3 that is disposed between the light sources 21 and 22 and that emits light upon being irradiated by the light beams; a dichroic mirrors 41 and a collimating optical systems 51 that are disposed between the wavelength conversion element 3 and the first light source 21; and a dichroic mirrors 42 and a collimating optical systems 52 that are disposed between the wavelength conversion element 3 and the second light source 22.

The first light source 21 and the second light source 22 are semiconductor light sources, laser diodes (LDs), or the like, which output monochromatic beams of light with high directivity. The first light source 21 and the second light source 22 output beams of light having the same characteristics as each other. In this embodiment, the monochromatic light beam is assumed to be a blue laser beam L having a wavelength of 450 nm. Each of the light sources 21 and 22 may be configured by arraying a plurality of (for example, 2×2 or 3×3) semiconductor light sources or LDs, which output laser beams L parallel to each other.

The wavelength conversion element 3 is an element that emits light upon being irradiated with the laser beams L (monochromatic light) from the light sources 21 and 22 and contains, for example, fluorophores or quantum dots that are excited by the laser beams L. In this embodiment, the wavelength conversion element 3 is assumed to be a fluorophore whose excitation wavelength band contains the 450 nm wavelength of the laser beams L and that generates fluorescence L' having a peak wavelength of 550 nm.

The fluorescence L' generated in the wavelength conversion element 3 upon being irradiated with the laser beams L from both sides is scattered in the forward traveling direction and the rearward traveling direction of the respective laser beams L. Thus, among the fluorescence L' generated by the laser beams L, one part thereof, namely, fluorescence L1', that is scattered towards the first light source 21 enters the first collimating optical system 51, and the other part thereof, namely, fluorescence L2', that is scattered towards the second light source 22 enters the second collimating optical system 52.

The first dichroic mirror 41, which is disposed between the first light source 21 and the wavelength conversion element 3, is disposed perpendicular to the optical axis X. The laser beam L incident on the first dichroic mirror 41 from the light source 21 is transmitted therethrough parallel to the optical axis X. The scattered fluorescence L1' coming from the wavelength conversion element 3 is reflected by the first dichroic mirror 41 parallel to the optical axis X.

The second dichroic mirror 42, which is disposed between the second light source 22 and the wavelength conversion element 3, is disposed at an inclination of 45° to the optical axis X. The laser beam L incident on the second dichroic mirror 42 from the second light source 22 is transmitted therethrough parallel to the optical axis X. The reflected fluorescence L2' coming from the wavelength conversion element 3 and the fluorescence L1' that is reflected back by the first dichroic mirror 41 and passes through the wavelength conversion element 3 are reflected by the second dichroic mirror 42 in a direction perpendicular to the optical axis X.

In this embodiment, the first dichroic mirror 41 and the second dichroic mirror 42 are assumed to be mirrors having the property that they transmit light with wavelengths of 500 nm or less and reflect light with wavelengths longer than 500 nm.

The first collimating optical system (first optical member) 51 is formed of, for example, a plano-convex lens (collimating lens) whose convex surface is disposed facing the first light source 21. The first collimating optical system 51 collimates the fluorescence L1' incident thereon from the wavelength conversion element 3 and radiates it towards the dichroic mirror 41. Also, the first collimating optical system 51 focuses the fluorescence L1' that is reflected back by the dichroic mirror 41 onto the wavelength conversion element 3.

The second collimating optical system (second optical member) 52 is formed of, for example, a plano-convex lens (collimating lens) whose convex surface is disposed facing the second light source 22. The second collimating optical system 52 collimates the fluorescence L1' and the fluorescence L2' incident thereon from the wavelength conversion element 3 and emits them parallel to the optical axis X.

The first collimating optical system 51 and the second collimating optical system 52 may be formed of a combination of a plurality of lenses. Instead of plano-convex lenses, rod integrators may be employed. The plano-convex lenses or rod integrators have simple lens configurations and can also collimate scattered light from the wavelength conversion element 3.

Next, the operation of the thus-configured light source apparatus 1 will be described.

With the light source apparatus 1 according to this embodiment, the blue laser beams L output from the two light sources 21 and 22 pass through the dichroic mirrors 41 and 42 along the single optical axis X and are incident on the wavelength conversion element 3, thus generating green fluorescence L' in the wavelength conversion element 3. Of the generated fluorescence L', the fluorescence L2' scattered towards the second light source 22 is converted to collimated light by the second collimating optical system 52 and is then deflected in a direction perpendicular to the optical axis X so as to be output outside the light source apparatus 1.

On the other hand, the fluorescence L1' scattered towards the first light source 21 is converted to collimated light by the first collimating optical system 51, is then reflected back by the dichroic mirror 41, and is focused onto the wavelength conversion element 3 by the first collimating optical system 51. The overlap between the light-emission wavelength band and the excitation wavelength band of the wavelength conversion element 3 is small or completely nonexistent. Therefore, the fluorescence L1' focused onto the wavelength conversion element 3 passes through the wavelength conversion element 3 with substantially no energy loss caused by exciting the fluorophores. Then, the fluorescence L1' that has passed through the wavelength conversion element 3, similarly to the fluorescence L2' that is scattered towards the second light source 22, is converted to collimated light by the second collimating optical system 52 and is then deflected in a direction perpendicular to the optical axis X and is output outside the light source apparatus 1. Accordingly, all of the fluorescence L' generated in the wavelength conversion element 3 is output from the light source apparatus 1 as the final illumination light.

The illumination light output from the light source apparatus 1 is used, for example, as illumination light for a microscope or projector. In other words, the illumination light is focused for irradiating a small region of an object to be illuminated, such as an observation specimen in a microscope, a liquid crystal panel provided in a liquid crystal projector, or the like.

In this case, with this embodiment, since the fluorescence L° is generated in the wavelength conversion element 3 by using the laser beams L from the two light sources 21 and 22, the amount of fluorescence L' generated in the wavelength conversion element 3 is approximately two times greater than when only a single light source is used, either the light source 21 or the light source 22. Here, the light sources 21 and 22 each have common optical elements 3, 41, 42, 51, and 52, forming optical systems that are independent of each other. In other words, Etendue at each of the light sources 21 and 22 is the same as Etendue when it is assumed that a single independent light source, that is, the light source 21 or 22, is provided. Therefore, the fluorescence L' due to each of the laser beams L output from the respective light sources 21 and 22 can be focused in a sufficiently small region that is restricted by the Etendue of each of the light sources 21 and 22.

Accordingly, an advantage is afforded in that the entire beam of illumination light can be focused with sufficiently high efficiency into a small region, and the brightness of the illumination light irradiating that small region can be increased by up to approximately two times compared with when the single light source 21 or 22 is used.

Figure 2:
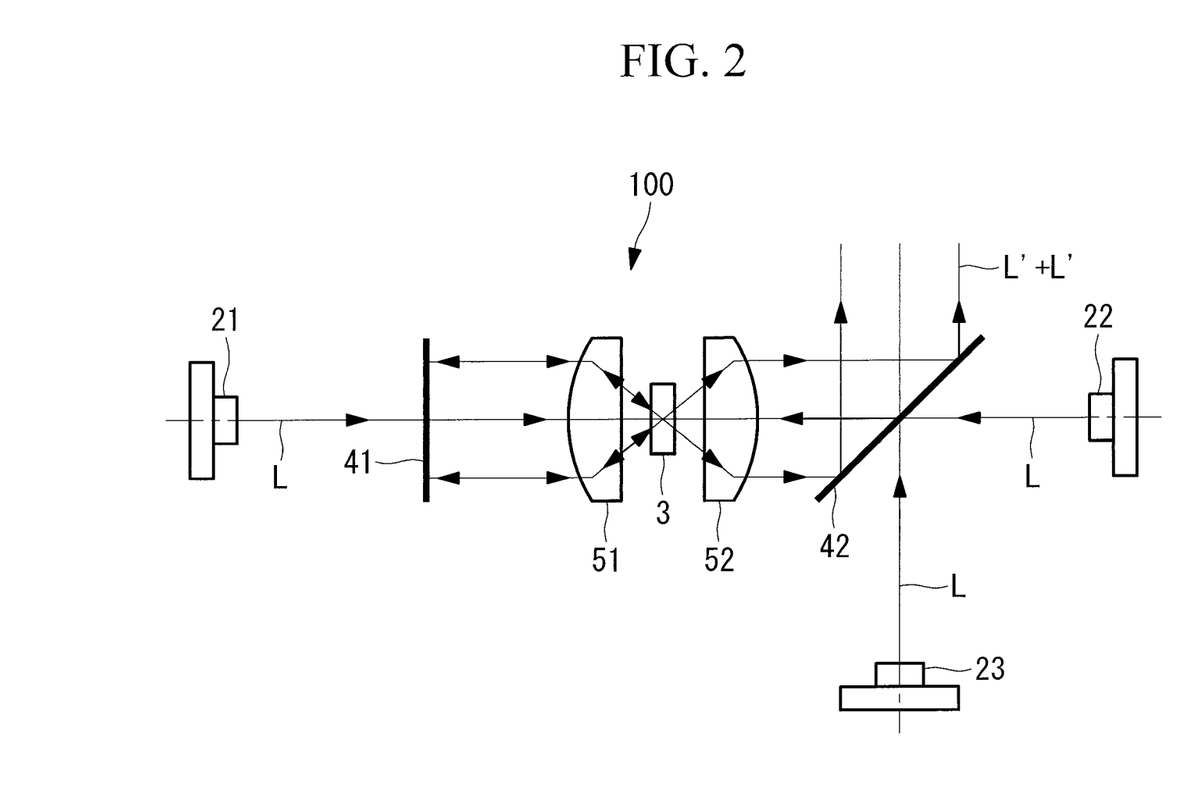
FIG. 2 is a diagram showing the overall configuration of a modification of the light source apparatus in FIG. 1.

In this embodiment, although it has been assumed that two systems of light sources 21 and 22 are provided, the number of systems of the light sources may be two or more. FIG. 2 shows the configuration of a light source apparatus 100 according to a modification, which is provided with three systems of light sources 21, 22, and 23. The third light source 23 is disposed at the opposite side of the second dichroic mirror 42 from the direction in which the fluorescence L' is deflected by the second dichroic mirror 42. The third light source 23 is formed of an LED and a collimating optical system, and the light L therefrom is incident on the second dichroic mirror 42 at an angle of 45°.

By doing so, the light formed by mixing the green fluorescence L' generated in the wavelength conversion element 3 and the light L from the third light source 23 is output from the light source apparatus 100 as illumination light. In this case, too, although the light L from the third light source 23, which is a separate system from the first light source 21 and the second light source 22, intermingles with the fluorescence L', since the light L and the fluorescence L' are superimposed in a wave-optical manner by the second dichroic mirror 42, the Etendue at the irradiation object is small. Therefore, the entire beam composed of the illumination light L' and the light L output from the light source apparatus 100 can be focused into a small region with sufficiently high efficiency, thus increasing the brightness.

Like the rotating color wheel described in Japanese Unexamined Patent Application, Publication No. 2012-13897, in the case of a configuration in which light of a plurality of colors is created with a time difference therebetween by mechanical driving, color breakup occurs, which is recognized by an observer as an afterimage of each color. In contrast, with the light source apparatus 100, since a mechanical driving mechanism is not required, no color breakup occurs, and it is possible to simultaneously generate the light L' and L of a plurality of colors.

In this embodiment, although it has been assumed that the fluorescence L' of a single color is created using a single wavelength conversion element 3, instead of this, light of a plurality of colors may be created using a plurality of wavelength conversion elements 3a and 3b.

Figure 3:
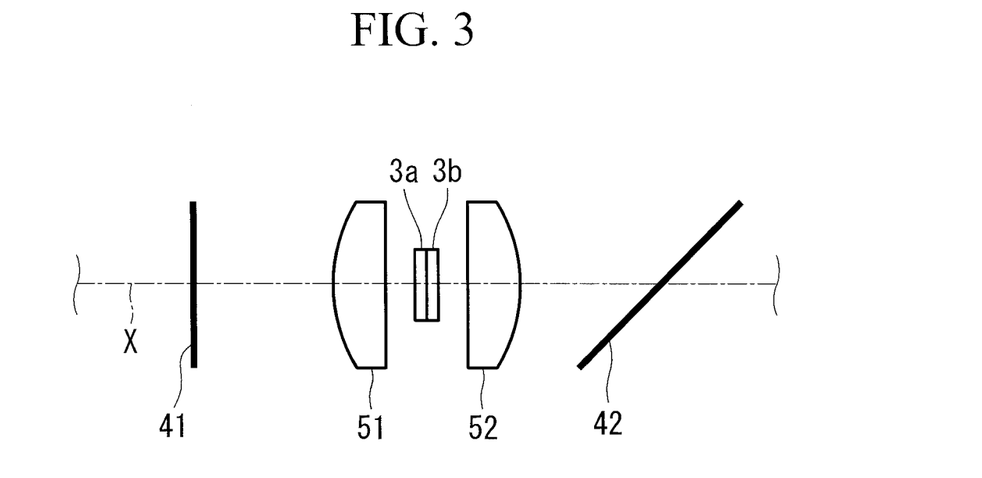
FIG. 3 is a diagram showing a modification of a wavelength conversion element provided in the light source apparatus in FIG. 1.

In the modification shown in FIG. 3, two wavelength conversion elements 3a and 3b arranged side-by-side in a direction parallel to the optical axis X are provided. The first wavelength conversion element 3a, which is disposed at the first light source 21 side, is identical to the wavelength conversion element 3 described above and generates green fluorescence L'. The second wavelength conversion element 3b contains fluorophores whose excitation wavelength band includes the 450 nm wavelength of the laser beam L and that generate fluorescence having a wavelength longer than that of the fluorescence L' that the first wavelength conversion element 3a generates, for example, having a peak wavelength of 650 nm.

When the blue laser beam L that has passed through the dichroic mirrors 41 and 42 is incident on the first wavelength conversion element 3a and the second wavelength conversion element 3b, green fluorescence L' is generated in the first wavelength conversion element 3a, and red fluorescence is generated in the second wavelength conversion element 3b. Of this green fluorescence L' and red fluorescence, the fluorescence that is scattered towards the second light source 22 enters the second collimating optical system 52. On the other hand, of the green fluorescence L' and the red fluorescence, the fluorescence that is scattered towards the first light source 21 is reflected back at the dichroic mirror 41, then passes through the first collimating optical system 51, the first wavelength conversion element 3a, and the second wavelength conversion element 3b, and then enters the second collimating optical system 52.

The overlap between the light-emission wavelength bands of the wavelength conversion elements 3a and 3b and the excitation wavelength bands of the wavelength conversion elements 3a and 3b is small or completely non-existent. Therefore, of the fluorescence, the fluorescence that is scattered towards the first light source 21 passes through the wavelength conversion elements 3a and 3b with substantially no energy loss caused by excitation of the fluorophores. Thus, all of the fluorescence generated in the first wavelength conversion element 3a and the second wavelength conversion element 3b is output from the second collimating optical system 52 as illumination light.

Thus, in this case, too, similarly to the light source apparatus 100 in FIG. 2, light of a plurality of colors can be simultaneously created without causing color breakup.

Figure 4:
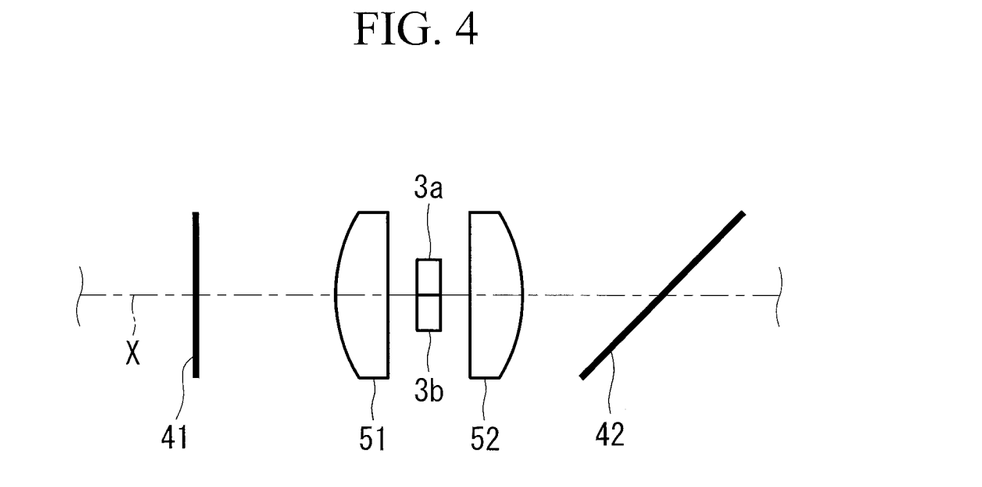
FIG. 4 is a diagram showing another modification of the wavelength conversion element provided in the light source apparatus in FIG. 1.

As shown in FIG. 4, the two wavelength conversion elements 3a and 3b may be arranged side-by-side in a direction that intersects the optical axis X. In this case, the adjoining surfaces of the two wavelength conversion elements 3a and 3b are disposed substantially on the optical axis X so that the laser beams L irradiate both of the wavelength conversion elements 3a and 3b. In this case, too, similarly to the wavelength conversion elements 3a and 3b in FIG. 3, it is possible to simultaneously create green fluorescence L' and red fluorescence from the blue laser beams L.

Figure 5:
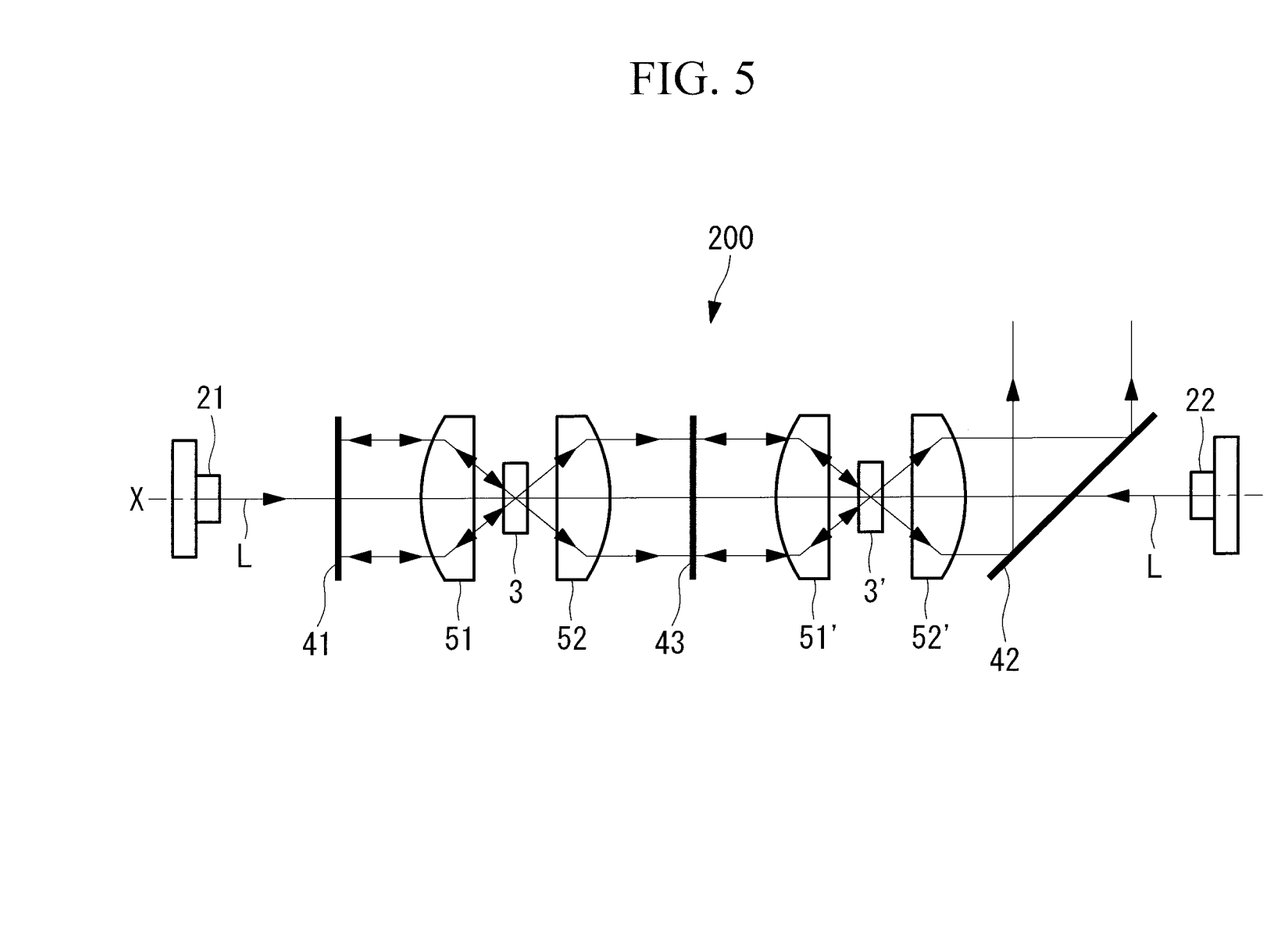
FIG. 5 is a diagram showing the overall configuration of another modification of the light source apparatus in FIG. 1.

In this embodiment, a plurality of sets of wavelength conversion elements and collimating optical systems may be provided in series, as in a light source apparatus 200 according to a modification shown in FIG. 5. In the light source apparatus 200 according to this modification, a plurality of sets (two sets in the illustrated example) of wavelength conversion elements 3 and 3' and collimating optical systems 51, 52, 51' and 52' are provided in series on the optical axis X between the first dichroic mirror 41 and the second dichroic mirror 42.

In this case, the wavelength conversion element 3' in the rear set generates fluorescence having a wavelength (for example, a peak wavelength of 650 nm) longer than that of the fluorescence L' generated by the wavelength conversion element 3 in the front set, similarly to the wavelength conversion element 3b in FIG. 2. In other words, the plurality of wavelength conversion elements 3 and 3' are configured so as to contain fluorophores in which the wavelength bands of the generated light shift towards longer wavelengths the farther they are positioned from the light source 21 on the optical axis X, in other words, the farther they are positioned towards the rear. A dichroic mirror 43 that transmits the laser beam L and the fluorescence L' generated by the wavelength conversion element 3 in the front set and that reflects the fluorescence generated by the wavelength conversion element 3' in the rear set is provided between the front set and the rear set. By doing so, the light source apparatus 200 is configured so that the laser beam L that has passed through the wavelength conversion element 3 in the front set excites the wavelength conversion element 3' in the rear set, causing light emission.

The light source apparatus 200 according to this modification may be provided with the third light source 23, as shown in FIG. 2, and a plurality of wavelength conversion elements 3a and 3b as each set of wavelength conversion elements 3 and 3', like those shown in FIG. 3 and FIG. 4.

In this case, too, it is possible to create light of a plurality of colors without causing color breakup.

Figure 6:
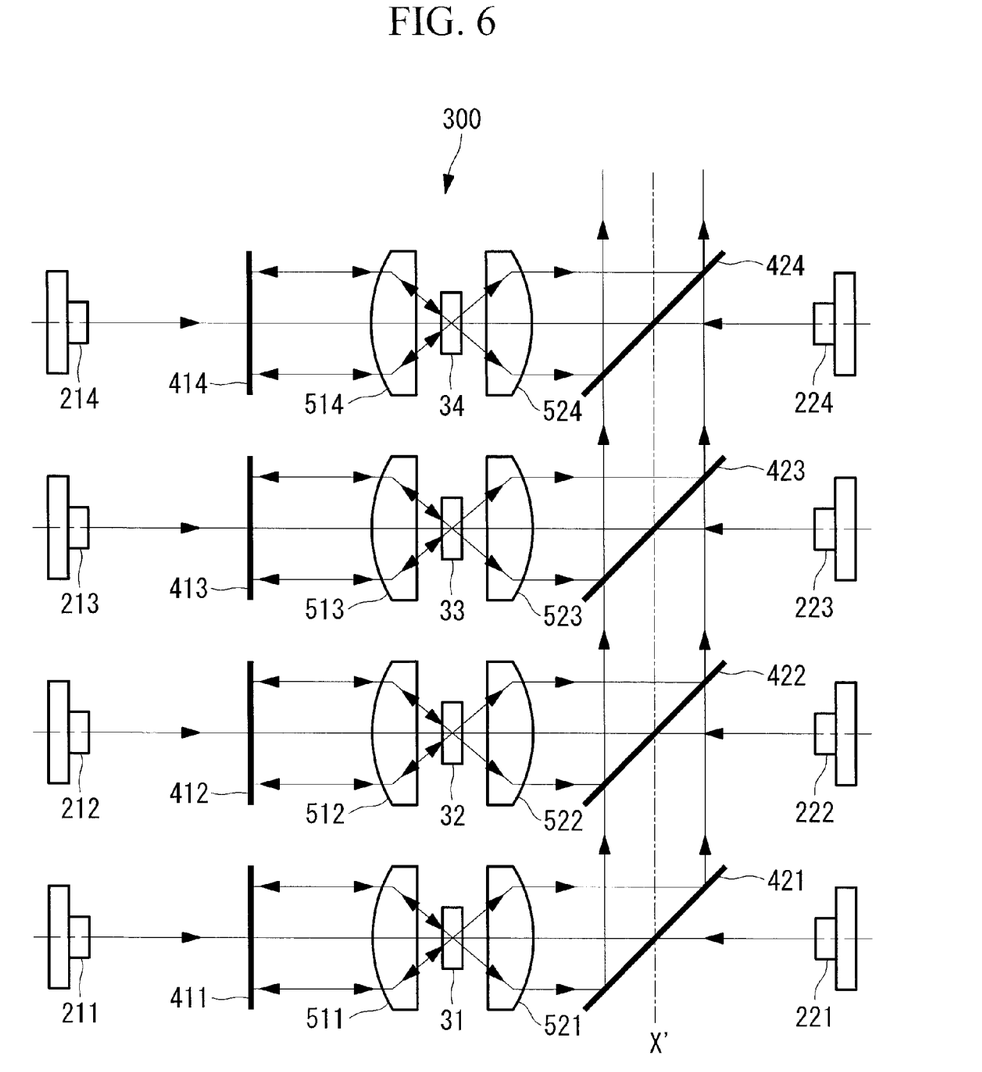
FIG. 6 is a diagram showing the overall configuration of another modification of the light source apparatus in FIG. 1.

In this embodiment, although the light sources 21 and 22, the wavelength conversion element 3, the dichroic mirrors 41 and 42, and the collimating optical systems 51 and 52 are provided in a single set, instead of this, as shown in FIG. 6, a plurality of sets thereof (four sets in the illustrated example) may be provided in parallel on a common optical axis X' of light beams which are deflected by dichroic mirrors 421, 422, 423, and 424.

In the light source apparatus 300 according to this modification, the light sources 211, 212, 213, 214, 221, 222, 223, and 224 in the respective sets output blue laser beams L, the same as the light sources 21 and 22 described above. The wavelength conversion elements 31, 32, 33, and 34 generate light of different colors from each other (for example, light-blue, green, yellow, and red). The wavelength characteristics of the individual dichroic mirrors 411, 412, 413, 414, 421, 422, 423, and 424 are appropriately set.

By doing so, it is possible to create illumination light containing light of four colors. In addition, the light sources 211, 212, 213, 214, 221, 222, 223, and 224 constitute optical systems that are independent of each other. Therefore, the entire beam of illumination light can be focused into a sufficiently small region which is limited by the Etendue values of the individual light sources 211, 212, 213, 214, 221, 222, 223, and 224, and it is possible to increase the brightness of the illumination light that irradiates this small region by up to 8-times compared with that when a single light source is used.

In this embodiment, although fluorophores and quantum dots have been given as examples of the light emitters contained in the wavelength conversion element 3, the light emitters in the wavelength conversion element 3 are not limited to these examples.

Furthermore, although the light source apparatus in this embodiment is provided with a collimating optical system, the configuration of the light source apparatus is not limited thereto, and a configuration in which a collimating optical system is not provided may also be adopted.

REFERENCE SIGNS LIST 1, 100, 200, 300 light source apparatus
21, 22, 23, 211, 212, 213, 214, 221, 222, 223, 224 light source
3, 3', 3a, 3b, 31, 32, 33, 34 wavelength conversion element
41, 411, 412, 413, 414 first dichroic mirror (first optical member)
42, 421, 422, 423, 424 second dichroic mirror (second optical member)
51, 511, 512, 513, 514 first collimating optical system
52, 521, 522, 523, 524 second collimating optical system
L laser beam (light)
L' fluorescence
X optical axis

The invention claimed is:

1. A light source apparatus comprising:
a first light source and a second light source that output light in mutually opposing directions along a single optical axis;
a wavelength conversion element that is disposed between the first light source and the second light source and that, upon being irradiated with the light output from the first light source and the second light source, generates light of a wavelength different from that of said light;
a first optical member that is disposed between the wavelength conversion element and the first light source, that transmits the light from the first light source, and that, of the light generated in the wavelength conversion element, reflects back light that is scattered towards the first light source, toward the wavelength conversion element, parallel to the optical axis; and
a second optical member that is disposed between the wavelength conversion element and the second light source, that transmits the light from the second light source, and that, of the light generated in the wavelength conversion element, deflects, in a direction intersecting the optical axis, the light scattered toward the second light source and the light reflected back by the first optical member.

2. The light source apparatus according to claim 1, wherein the wavelength conversion element has a fluorophore or quantum dot that is excited by the light output from the first light source and the second light source.

3. The light source apparatus according to claim 2, further comprising:
a first collimating optical system that is disposed between the wavelength conversion element and the first optical member and that converts the light scattered towards the first light source from the wavelength conversion element into collimated light; and
a second collimating optical system that is disposed between the wavelength conversion element and the second optical member and that converts the light that is scattered towards the second light source from the wavelength conversion element into collimated light.

4. The light source apparatus according to claim 3, wherein at least one of the first collimating optical system and the second collimating optical system includes a collimating lens or a rod integrator.

5. The light source apparatus according to claim 3, wherein a plurality of sets each consisting of the wavelength conversion element, the first collimating optical system, and the second collimating optical system are provided in series on the optical axis, and the wavelength conversion elements in the individual sets generate light of different colors from each other.

6. The light source apparatus according to claim 3, further comprising:
an additional light source that is disposed on the opposite side of the second optical member from the direction in which the light is deflected by the second optical member and that outputs light along the same optical axis as the light deflected by the second optical member,
wherein the second optical member also transmits the light output from the additional light source.

7. The light source apparatus according to claim 3, wherein a plurality of the wavelength conversion elements are provided, which are arranged in a direction along the optical axis or in a direction intersecting the optical axis so that the light from the first light source and the second light source is radiated all together, and which generate light of different colors from each other.

8. The light source apparatus according to claim 3, wherein a plurality of sets each including the first light source, the second light source, the wavelength conversion element, the first optical member, and the second optical member are provided in parallel, with the optical axes of the light deflected by the second optical members being a common axis.

9. The light source apparatus according to claim 2, further comprising:
an additional light source that is disposed on the opposite side of the second optical member from the direction in which the light is deflected by the second optical member and that outputs light along the same optical axis as the light deflected by the second optical member, wherein the second optical member also transmits the light output from the additional light source.

10. The light source apparatus according to claim 2, wherein a plurality of the wavelength conversion elements are provided, which are arranged in a direction along the optical axis or in a direction intersecting the optical axis so that the light from the first light source and the second light source is radiated all together, and which generate light of different colors from each other.

11. The light source apparatus according to claim 2, wherein a plurality of sets each including the first light source, the second light source, the wavelength conversion element, the first optical member, and the second optical member are provided in parallel, with the optical axes of the light deflected by the second optical members being a common axis.

12. The light source apparatus according to claim 1, further comprising:
   a first collimating optical system that is disposed between the wavelength conversion element and the first optical member and that converts the light scattered towards the first light source from the wavelength conversion element into collimated light; and
   a second collimating optical system that is disposed between the wavelength conversion element and the second optical member and that converts the light that is scattered towards the second light source from the wavelength conversion element into collimated light.

13. The light source apparatus according to claim 12, wherein at least one of the first collimating optical system and the second collimating optical system includes a collimating lens or a rod integrator.

14. The light source apparatus according to claim 13, wherein a plurality of sets each consisting of the wavelength conversion element, the first collimating optical system, and the second collimating optical system are provided in series on the optical axis, and the wavelength conversion elements in the individual sets generate light of different colors from each other.

15. The light source apparatus according to claim 12, wherein a plurality of sets each consisting of the wavelength conversion element, the first collimating optical system, and the second collimating optical system are provided in series on the optical axis, and the wavelength conversion elements in the individual sets generate light of different colors from each other.

16. The light source apparatus according to claim 12, further comprising:
   an additional light source that is disposed on the opposite side of the second optical member from the direction in which the light is deflected by the second optical member and that outputs light along the same optical axis as the light deflected by the second optical member,
   wherein the second optical member also transmits the light output from the additional light source.

17. The light source apparatus according to claim 12, wherein a plurality of the wavelength conversion elements are provided, which are arranged in a direction along the optical axis or in a direction intersecting the optical axis so that the light from the first light source and the second light source is radiated all together, and which generate light of different colors from each other.

18. The light source apparatus according to claim 12, wherein a plurality of sets each including the first light source, the second light source, the wavelength conversion element, the first optical member, and the second optical member are provided in parallel, with the optical axes of the light deflected by the second optical members being a common axis.

19. The light source apparatus according to claim 1, further comprising:
   an additional light source that is disposed on the opposite side of the second optical member from the direction in which the light is deflected by the second optical member and that outputs light along the same optical axis as the light deflected by the second optical member,
   wherein the second optical member also transmits the light output from the additional light source.

20. The light source apparatus according to claim 1, wherein a plurality of the wavelength conversion elements are provided, which are arranged in a direction along the optical axis or in a direction intersecting the optical axis so that the light from the first light source and the second light source is radiated all together, and which generate light of different colors from each other.

21. The light source apparatus according to claim 1, wherein a plurality of sets each including the first light source, the second light source, the wavelength conversion element, the first optical member, and the second optical member are provided in parallel, with the optical axes of the light deflected by the second optical members being a common axis.

* * * * *